(12) United States Patent
Suzuki et al.

(10) Patent No.: US 9,977,347 B2
(45) Date of Patent: May 22, 2018

(54) POSITIONING APPARATUS, LITHOGRAPHY APPARATUS, AND METHOD OF MANUFACTURING ARTICLE

(71) Applicant: CANON KABUSHIKI KAISHA, Tokyo (JP)

(72) Inventors: Kentaro Suzuki, Machida (JP); Nobushige Korenaga, Utsunomiya (JP); Satoshi Iwatani, Utsunomiya (JP)

(73) Assignee: CANON KABUSHIKI KAISHA, Tokyo (JP)

( * ) Notice: Subject to any disclaimer, the term of this patent is extended or adjusted under 35 U.S.C. 154(b) by 0 days. days.

(21) Appl. No.: 15/589,270

(22) Filed: May 8, 2017

(65) Prior Publication Data
US 2017/0329237 A1 Nov. 16, 2017

(30) Foreign Application Priority Data
May 16, 2016 (JP) ................. 2016-098152

(51) Int. Cl.
G03B 27/42 (2006.01)
G03B 27/58 (2006.01)
G03F 7/20 (2006.01)

(52) U.S. Cl.
CPC .......... *G03F 7/70775* (2013.01); *G03F 7/707* (2013.01)

(58) Field of Classification Search
CPC ...... G03F 7/709; G03F 7/70716; G03F 7/707; G03F 7/7075; G03F 7/7095; G03F 7/70975; G03F 7/70758; G03F 7/70775; G03F 7/70816; G03F 7/20; G03F 7/70825
See application file for complete search history.

(56) References Cited

U.S. PATENT DOCUMENTS 6,635,887 B2    10/2003   Kwan et al.

FOREIGN PATENT DOCUMENTS

| CN | 101405838 A | 4/2009 |
| JP | S62-152633 A | 7/1987 |
| JP | 3145355 B2 | 3/2001 |
| JP | 2002025902 A | 1/2002 |
| JP | 2005195606 A | 7/2005 |
| JP | 2014238402 A | 12/2014 |
| TW | 200839465 A | 10/2008 |

OTHER PUBLICATIONS

Office Action issued in Taiwanese Appln. No. 106113971 dated Jan. 25, 2018. English translation provided.

*Primary Examiner* — Mesfin Asfaw
(74) *Attorney, Agent, or Firm* — Rossi, Kimms & McDowell LLP (57) ABSTRACT

An apparatus for moving movable part on surface parallel to first and second directions includes single guide to constrain position of the movable part in the second direction and drive mechanism to drive the movable part. The movable part includes first movable member movable in the first direction while being guided by the guide, second movable member having first and second ends, the first end being connected to the first movable member via rotation bearing and moving above the surface, and third movable member movable within range between the first and second ends while being guided by the second movable member. The drive mechanism includes first driver to drive the first end of the second movable member in the first direction, and second driver to drive the second end of the second movable member in the first direction.

13 Claims, 6 Drawing Sheets

POSITIONING APPARATUS, LITHOGRAPHY APPARATUS, AND METHOD OF MANUFACTURING ARTICLE

BACKGROUND OF THE INVENTION

Field of the Invention

The present invention relates to a positioning apparatus, a lithography apparatus, and a method of manufacturing an article.

Description of the Related Art

In this specification, directions are shown in an X-Y-Z coordinate system in which a horizontal plane forms an X-Y plane. Let an X direction, a Y direction, and a Z direction be the directions parallel to an X-axis, a Y-axis, and a Z-axis, respectively, in the X-Y-Z coordinate system. Let $\theta X$, $\theta Y$, and $\theta Z$, respectively, be rotation about the X-axis, rotation about the Y-axis, and rotation about the Z-axis. Control or driving with regard to the X-axis, the Y-axis, and the Z-axis means control or driving with regard to the direction parallel to the X-axis, the direction parallel to the Y-axis, and the direction parallel to the Z-axis, respectively. Further, control or driving with regard to a $\theta X$-axis, a $\theta Y$-axis, and a $\theta Z$-axis means control or driving with regard to rotation about an axis parallel to the X-axis, rotation about an axis parallel to the Y-axis, and rotation about an axis parallel to the Z-axis, respectively. A position is information that can be specified based on X-axis, Y-axis, and Z-axis coordinates. An attitude is information that can be specified by values on the $\theta X$-axis, the $\theta Y$-axis, and the $\theta Z$-axis. Positioning means controlling the position and/or the attitude.

An exposure apparatus and an imprint apparatus can be given as examples of a lithography apparatus which transfers an original pattern to a substrate. The exposure apparatus projects the original pattern on the substrate coated with a photosensitive agent via a projection optical system, forming a latent image corresponding to the original pattern in the photosensitive agent. The imprint apparatus cures an imprint material arranged on the substrate in a state in which an original (mold) is brought into contact with the imprint material, forming a pattern of the imprint material on the substrate.

The lithography apparatus includes a positioning apparatus configured to position the substrate. Alignment with respect to an image formed by the projection optical system is required of a substrate positioning apparatus incorporated into the exposure apparatus. Therefore, the substrate positioning apparatus incorporated into the exposure apparatus can typically include a mechanism which positions the substrate with respect to six axes of the X-axis, the Y-axis, the Z-axis, the $\theta X$-axis, the $\theta Y$-axis, and the $\theta Z$-axis for alignment with respect to the image formed by the projection optical system. It is good enough in the imprint apparatus that relative alignment between the substrate and the original can be performed. Thus, it may only necessary for the substrate positioning apparatus incorporated into the imprint apparatus to include a mechanism which positions the substrate with respect to the X-axis, the Y-axis, and the $\theta Z$-axis. In the imprint apparatus, an original driving mechanism can adjust the other axes.

Japanese Patent No. 3145355 describes a movement guide apparatus which includes a Y stage moving in the Y direction and an X stage moving in the X direction on the Y stage. Note that a fixed guide guides only one end out of both the ends of the Y stage. When the movement guide apparatus having such an XY-stage arrangement is utilized, a mechanism mounted on the X stage can perform the control of axes other than the X-axis and the Y-axis, for example, the control of the $\theta Z$-axis.

There is also a positioning apparatus which achieves the control of the $\theta Z$-axis by pivoting the X stage or the Y stage. Japanese Patent Laid-Open No. S62-152633 describes a gas bearing type multi-axis stage assembly which includes an intermediate stage element moving in the Y direction and an X-Y-$\theta$ stage moving in the X direction with respect to the intermediate stage element, and in which the X-direction positions at both the ends of the intermediate stage element are constrained. In this stage assembly, the X-Y-$\theta$ stage can be pivoted by pivoting the intermediate stage element about the Z-axis. A positioning apparatus having such an arrangement is excellent in that positioning with regard to the X-axis, the Y-axis, and the $\theta Z$-axis can be performed with a simple arrangement.

In the arrangement described in Japanese Patent Laid-Open No. S62-152633, both the X-direction positions of both the ends of the intermediate stage element moving in the Y direction are constrained, extremely restricting a stroke on the $\theta Z$-axis (rotation about the Z-axis). Therefore, in a substrate positioning apparatus having such an arrangement, an adjustable range with regard to the $\theta Z$-axis is extremely small.

SUMMARY OF THE INVENTION

The present invention provides a technique advantageous in making a stroke with regard to rotation larger with a simple arrangement.

A first aspect of the present invention provides a positioning apparatus configured to move a movable part on a surface parallel to a first direction and a second direction perpendicular to each other, and comprising a single guide serving as a guide configured to constrain a position of the movable part in the second direction and a drive mechanism configured to drive the movable part, wherein the movable part includes a first movable member movable in the first direction while being guided by the guide, a second movable member having a first end and a second end, the first end being connected to the first movable member via a rotation bearing and moving above the surface, and a third movable member movable within a predetermined range between the first end and the second end while being guided by the second movable member, and the drive mechanism includes a first driver configured to drive the first end of the second movable member in the first direction, and a second driver configured to drive the second end of the second movable member in the first direction.

A second aspect of the present invention provides a lithography apparatus comprising: a positioning apparatus as defined as the first aspect of the present invention; and a substrate chuck mounted on the third movable member of the positioning apparatus, wherein the apparatus is configured to transfer an original pattern to a substrate held by the substrate chuck.

A third aspect of the present invention provides a method of manufacturing an article, comprising: transferring a pattern to a substrate by using a lithography apparatus as defined as the second aspect of the present invention; and processing the substrate to which the pattern has been transferred to obtain the article.

Further features of the present invention will become apparent from the following description of exemplary embodiments with reference to the attached drawings.

DESCRIPTION OF THE EMBODIMENTS

An exemplary embodiment of the present invention will be described below with reference to the accompanying drawings.

A positioning apparatus according to the present invention can be applied to a substrate positioning apparatus in a lithography apparatus such as an imprint apparatus and an exposure apparatus. However, it may be applied to another apparatus such as a machining apparatus, an inspection apparatus, or a microscope. An example will be described below in which the positioning apparatus according to the present invention is applied to the imprint apparatus.

The imprint apparatus is an apparatus which brings a mold and an imprint material arranged on a substrate into contact with each other, and applies curing energy to the imprint material, forming a pattern of a cured product on the substrate. The imprint material can be a curable composition (can also be referred to as an uncured resin) which is cured by receiving the curing energy. The curing energy can be an electromagnetic wave, heat or the like. The electromagnetic wave can be, for example, light (such as infrared light, visible rays, or ultraviolet light) whose wavelength is selected from a range of 10 nm (inclusive) to 1 mm (inclusive).

Curable compositions are compositions cured by receiving curing energy such as an electromagnetic wave or heat. Out of these compositions, a photo-curable composition that is cured by light can contain at least a polymerizable compound and a photopolymerization initiator, and can further contain a non-polymerizable compound or solvent as needed. The non-polymerizable compound can be at least a material selected from the group consisting of a sensitizer, a hydrogen donor, an internal mold release agent, a surfactant, an antioxidant, a polymer component, and the like.

The imprint material can be applied onto the substrate in the form of a film by a spin coater or a slit coater. Alternatively, a liquid injection head can supply, onto the substrate, the imprint material in the form of a droplet, or in the form of an island or film formed by a plurality of droplets connected to each other. The viscosity (viscosity at 25° C.) of the imprint material can be set at, for example, 1 mPa·s (inclusive) to 100 mPa·s (inclusive).

The substrate can be a member made of glass, ceramics, a metal, a semiconductor, a resin, or the like. A layer made of a material different from the member may be formed on the surface of the member, as needed. For example, a silicon wafer, a compound semiconductor wafer, a silica glass plate, or the like is used as the substrate.

Figure 1:
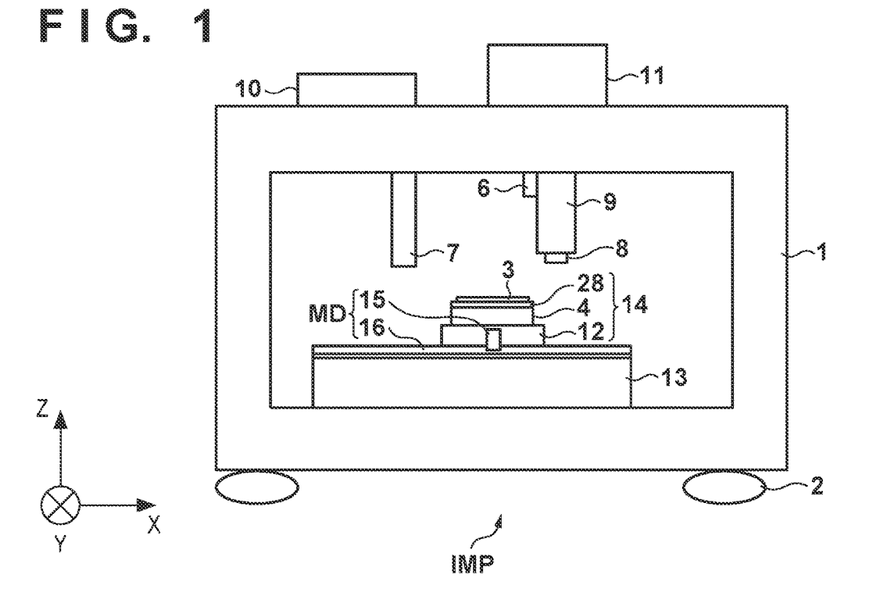
FIG. 1 is a view schematically showing the arrangement of an imprint apparatus according to one embodiment of the present invention.

FIG. 1 schematically shows the arrangement of an imprint apparatus IMP according to one embodiment of the present invention. A main body structure 1 of the imprint apparatus IMP is installed on a floor via a plurality (typically three or four) of anti-vibration units 2. A substrate 3 is placed on a substrate chuck (not shown) of a positioning apparatus 14. The substrate 3 is placed on the substrate chuck such that its surface is arranged parallel to a horizontal plane (X-Y plane). The positioning apparatus 14 can have, regarding an X-axis and a Y-axis, a stroke large enough to move the substrate 3 to a substrate change position for loading and unloading the substrate 3 or a drop position for arranging the imprint material on the substrate 3.

The positioning apparatus 14 can include a base plate 13, an X beam 12 arranged on the base plate 13 and moving in an X direction (first direction), a Y slider 4 movable in a Y direction while being guided by the X beam 12, and a top plate (XYθ-stage) 28 mounted on the Y slider 4. The substrate chuck (not shown) holding the substrate 3 can be mounted on the top plate 28. For example, a measurement device MD such as a linear encoder which includes a detection head 15 moving together with the X beam 12 and a scale 16 provided on the base plate 13 measures the position of the X beam 12. Likewise, for example, a measurement device such as a linear encoder which includes a detection head moving together with the Y slider 4 and a scale provided for the X beam can measure the position of the Y slider 4. Instead of these linear encoders, a laser interferometer that can be formed by a mirror provided in a movable member (for example, the Y slider 4) of the positioning apparatus 14 and a laser head may be provided.

A supply unit (dispenser) 7 can supply or apply the imprint material on a shot region of the substrate 3. An external apparatus of the imprint apparatus IMP may supply or apply the imprint material on the shot region of the substrate 3. The shot region is a region where a pattern is formed by one imprint process in the imprint apparatus IMP. The imprint process can include an operation of bringing a mold 8 into contact with the imprint material on the substrate and an operation of separating the mold (original) 8 from the cured imprint material.

The imprint apparatus IMP can include an imprint head 9 which drives the mold 8. The imprint head 9 can be configured to hold the mold 8 and drive the mold 8 with respect to a plurality of axes (for example, six axes of the X-axis, the Y-axis, a Z-axis, a θX-axis, a θY-axis, and a θZ-axis). The imprint head 9 can control, by driving the mold 8 with regard to the Z-axis, contact of the mold 8 with the imprint material on the substrate 3 and separation of the mold 8 from the cured imprint material on the substrate 3.

The imprint apparatus IMP can include, near the imprint head 9, a sensor 6 which detects the displacement of the mold 8 in the X and Y directions. The imprint apparatus IMP can also include an alignment detector 10 which detects the relative positions of the mold 8 and the shot region of the substrate 3 in the X direction and the Y direction. The substrate 3 where the lithography apparatus has formed a layer includes an alignment mark. The alignment detector 10 can be configured to detect the relative positions of the mold 8 and the shot region of the substrate 3 by using the alignment mark of the substrate 3 and an alignment mark of the mold 8.

The imprint apparatus IMP can include a curing unit 11 which supplies energy for curing the imprint material to the imprint material. The curing unit 11 supplies the energy for curing the imprint material to the imprint material after bringing the mold 8 into contact with the imprint material on the substrate 3 and sufficiently filling, with the imprint material, the concave portion of a concave-convex pattern of the mold 8.

Figure 2:
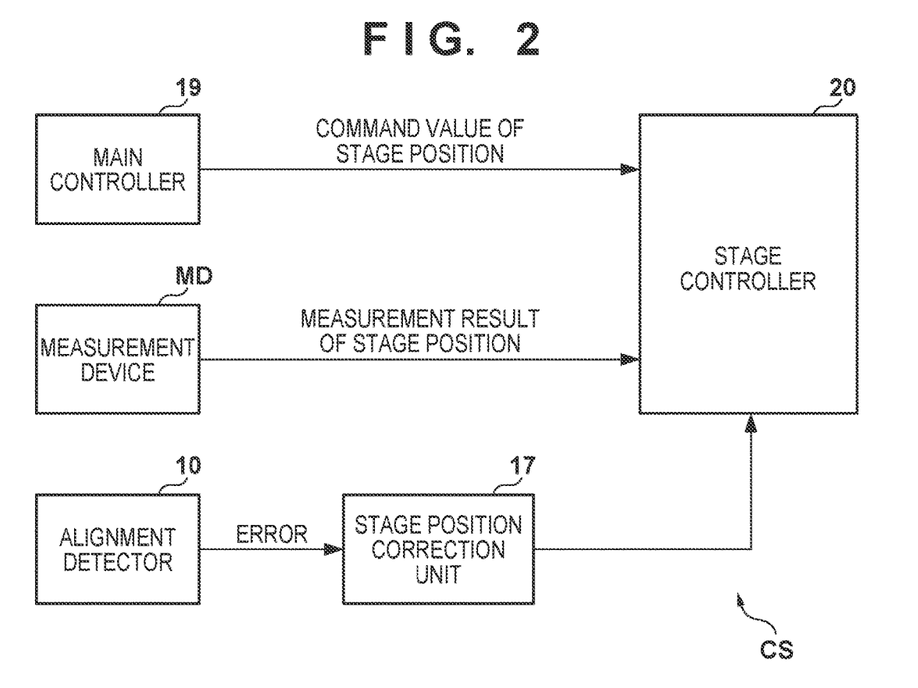
FIG. 2 is a block diagram exemplifying the arrangement of a control system of a positioning apparatus that can be incorporated into the imprint apparatus.

FIG. 2 exemplifies a control system CS of the positioning apparatus 14. The operation of the control system CS will be described together with the operation of the imprint apparatus IMP. A stage controller 20 can control the position of the top plate (can also be considered as the position of the Y slider 4 or the substrate 3). The stage controller 20 can constitute a feedback control system which controls the positioning apparatus 14 based on the deviation between a command value of a stage position (the position of the top plate 28) transmitted from a main controller 19 and a measurement result of the stage position by the measurement device MD.

First, the main controller 19 supplies the command value of the stage position indicating the substrate change position to the stage controller 20, and the stage controller 20 moves the top plate 28 based on this command value and the measurement result of the stage position supplied from the measurement device MD. At the substrate change position, a conveyance mechanism (not shown) places the substrate 3 on the substrate chuck on the top plate 28. At this time, the substrate 3 may be arranged on the substrate chuck with an error with regard to the X-axis, the Y-axis, and the θZ-axis depending on the positioning accuracy of the conveyance mechanism. The alignment detector 10 can measure this error by detecting the relative positions of the alignment mark of the substrate 3 and a reference mark (not shown) provided on the top plate 28.

The error measured by the alignment detector 10 is transmitted to a stage position correction unit 17. The stage position correction unit 17 provides this error to the stage controller 20 as an offset value. The aforementioned error can be canceled by causing the stage controller 20 to correct the command value of the stage position from the main controller 19 with the offset value. Instead of such an operation, the imprint head 9 may be caused to adjust the position of the mold 8 based on the error measured by the alignment detector 10. Alternatively, based on the error measured by the alignment detector 10, the error may be canceled by both the control of the top plate 28 by the stage controller 20 and the control of the mold 8 by the imprint head 9.

Then, via the stage controller 20, the main controller 19 controls the positioning apparatus 14 such that the shot region of the substrate 3 is positioned below the supply unit 7 and controls the supply unit 7 such that the imprint material is supplied onto the shot region. Then, via the stage controller 20, the main controller 19 controls the positioning apparatus 14 such that the shot region is positioned immediately below the mold 8 and controls the imprint head 9 such that the mold 8 contacts the imprint material on the shot region. Note that in an example, the gap between the upper surface of the substrate 3 and the pattern surface of the mold 8 is set to 1 μm or less, bringing the mold 8 and the imprint material on the substrate 3 into contact with each other, and filling, with the imprint material, the concave portion of a concave-convex pattern on the pattern surface.

Note that the relative positional shift between the mold 8 and the shot region of the substrate 3 is large immediately after the imprint material on the substrate 3 and the pattern surface of the mold 8 are brought into contact with each other. The alignment detector 10 measures this positional shift. Based on that measurement result, the positioning apparatus 14 is controlled via the stage position correction unit 17 and the stage controller 20. By repeating such an operation, the relative positional shift between the mold 8 and the shot region of the substrate 3 can fall within an allowable range. Instead of such an operation, based on the error measured by the alignment detector 10, the imprint head 9 may be caused to adjust the position of the mold 8 so as to make the relative positional shift smaller. Alternatively, based on the error measured by the alignment detector 10, the relative positional shift may be controlled by both the control of the top plate 28 by the stage controller 20 and the control of the mold 8 by the imprint head 9.

After the relative positional shift between the mold 8 and the shot region of the substrate 3 falls within the allowable range, the main controller 19 controls the curing unit 11 such that the curing energy is supplied to the imprint material, curing the imprint material. Subsequently, the main controller 19 controls the imprint head 9 such that the mold 8 is separated from the cured imprint material.

Figure 3:
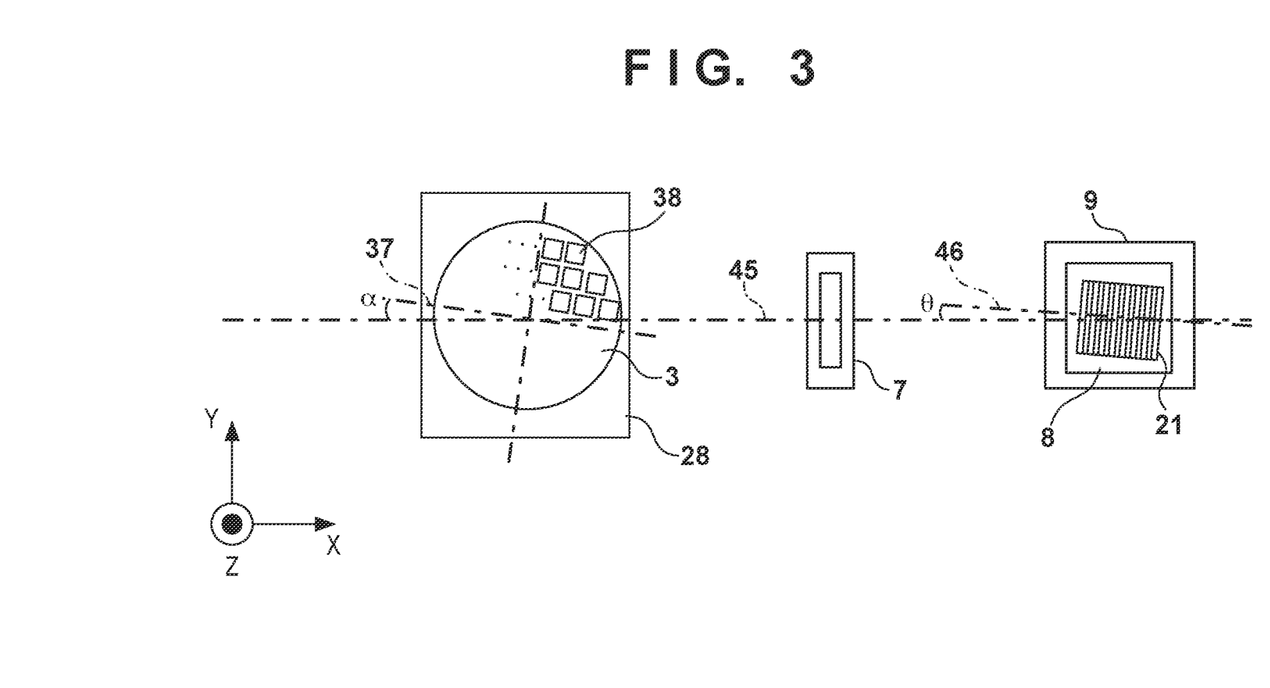
FIG. 3 is a view exemplifying the relationship among the attitudes of a substrate, a reference axis, and a mold in the imprint apparatus.

FIG. 3 exemplifies the relationship among the attitudes of the substrate 3, a reference axis 45, and the mold 8 in the imprint apparatus IMP. The conveyance mechanism (not shown) conveys the substrate 3 onto the substrate chuck mounted on the top plate 28 of the positioning apparatus 14. At this time, the substrate 3 can be arranged on the substrate chuck mounted on the top plate 28 in an attitude α. The attitude α indicates the rotation angle in a direction 37 of the substrate 3 with respect to the reference axis 45. The reference axis 45 indicates a direction that moves the top plate 28 (substrate 3) when the supply unit (dispenser) 7 supplies the imprint material onto the substrate 3. When the imprint material is arranged in the shot region of the substrate 3, the direction 37 of the substrate 3 needs to match the reference axis 45.

A direction 46 of a pattern region 21 of the mold 8 can have a tilt θ with respect to the reference axis 45. The tilt θ can be caused by a drawing error of the pattern with respect to the mold 8 or a mounting error of the mold 8 with respect to the imprint head 9.

Figure 4:
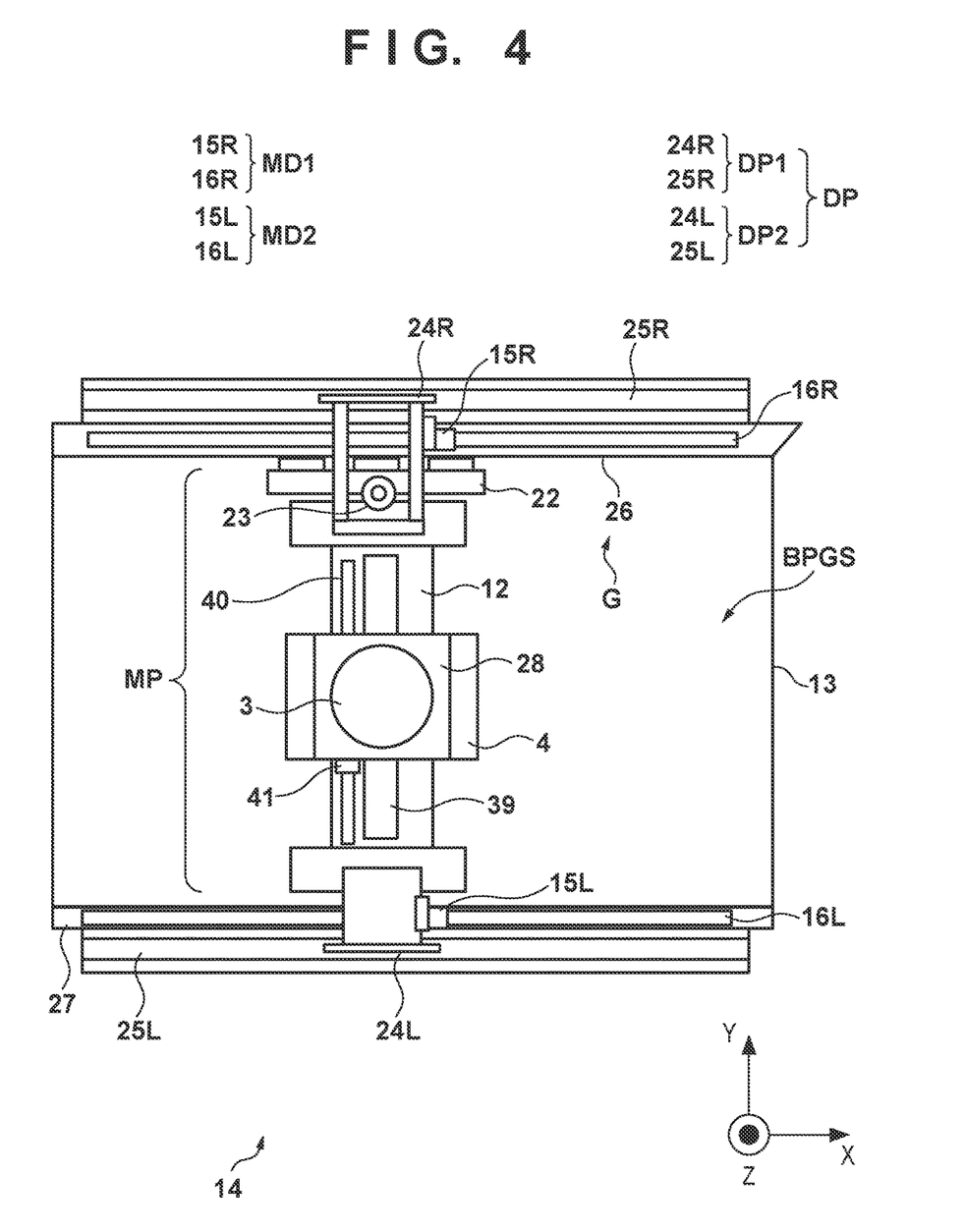
FIG. 4 is a view exemplifying the detailed arrangement of the positioning apparatus.
Figure 5:
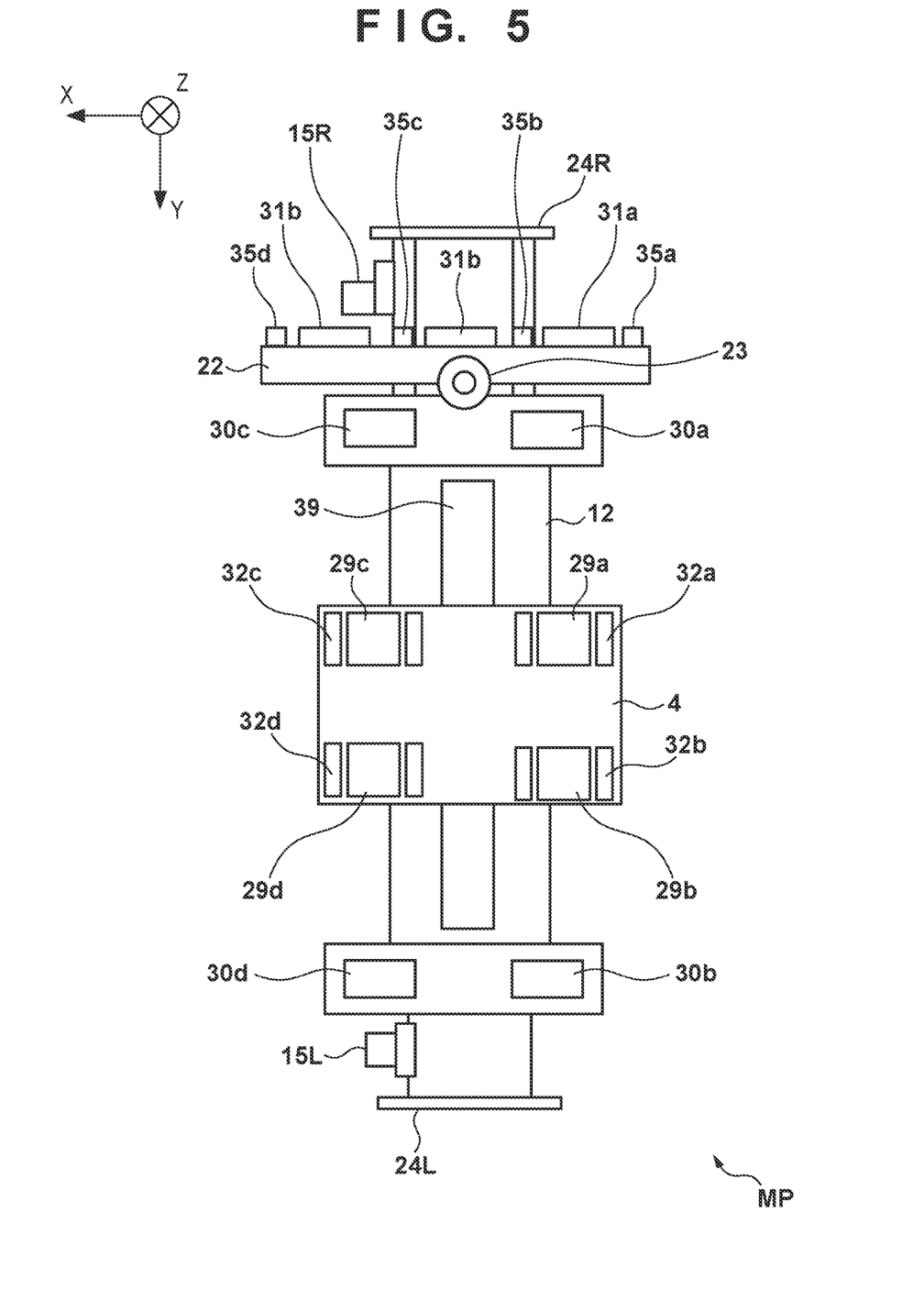
FIG. 5 is a view showing the bottom of a movable part of the positioning apparatus.
Figure 6:
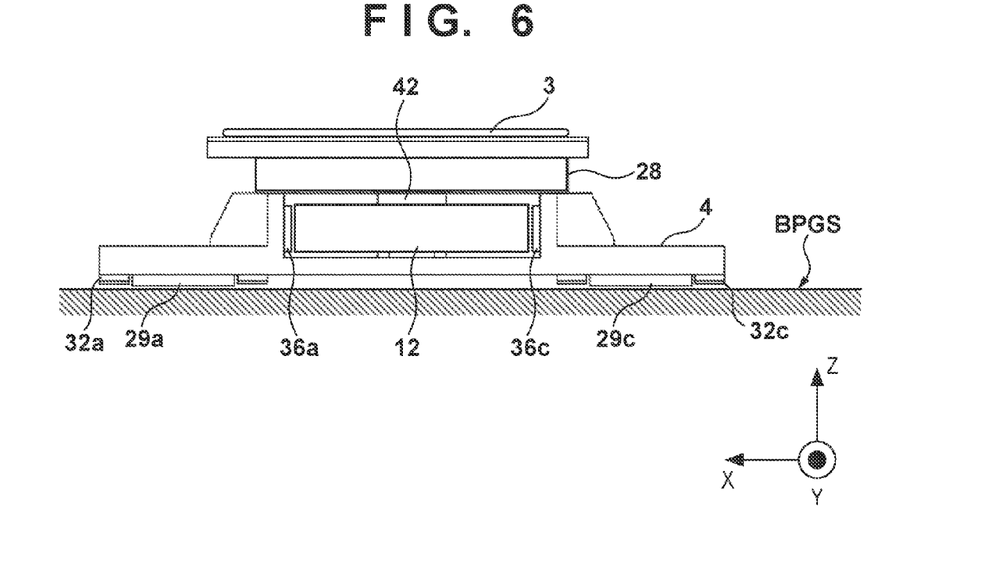
FIG. 6 is a view showing the cross section of the movable part of the positioning apparatus.

FIG. 4 shows an example of the detailed arrangement of the positioning apparatus 14. FIG. 5 shows a movable part MP of FIG. 4. FIG. 6 shows the cross section of the movable part MP. The positioning apparatus 14 is configured as the substrate positioning apparatus (substrate stage apparatus) which positions the substrate 3. The positioning apparatus 14 is configured to move the movable part MP above a guide surface BPGS of the base plate 13. The guide surface BPGS is a surface (a surface parallel to the X-Y plane) parallel to the X direction (first direction) and the Y direction (second direction) perpendicular to each other. The base plate 13 can be, for example, a sealed granite base plate, or a base plate formed by performing ceramic spraying or plating on a silicon steel sheet.

The positioning apparatus 14 includes a single guide G as a guide which constrains the position of the movable part MP in the Y direction (second direction). This means that the positioning apparatus 14 includes only one guide G as the guide which constrains the position of the movable part MP in the Y direction (second direction). The guide G can include a guide surface 26 parallel to the X direction (first direction). The guide surface 26 can be a surface perpendicular to the guide surface BPGS of the base plate 13. The guide G can be fixed to the base plate 13. Alternatively, the guide G may be provided in the base plate 13.

The positioning apparatus 14 also includes a drive mechanism DP which drives the movable part MP. In the example shown in FIG. 4, the upper surface of the base plate 13 forms the guide surface BPGS. However, the upper surface of the base plate 13 may not be used as the guide surface. In this case, the drive mechanism DP or another mechanism can support the movable part MP.

The movable part MP includes an X movable member (first movable member) 22, the X beam (second movable member) 12, and the Y slider (third movable member) 4. The X movable member 22 is movable in the X direction (first direction) while being guided by the guide G (guide surface 26). The X beam 12 can be supported and guided by the guide surface BPGS of the base plate 13 via a static pressure bearing formed by static pressure pads (static pressure bottom pads) 30a, 30b, 30c, and 30d. The X beam 12 has the first end and the second end. The first end is connected to the X movable member 22 via a rotation bearing 23 and moves above the guide surface BPGS of the base plate 13. The Y slider 4 is movable within a predetermined range between the first end and the second end while being guided by the X beam 12. The X movable member 22 can be guided by the guide G (guide surface 26) via a static pressure bearing formed by static pressure pads (X yaw static pressure pads) 31a, 31b, and 31c. That is, the X movable member 22 can be guided by the guide G (guide surface 26) without contacting the guide G (guide surface 26).

The drive mechanism DP includes a first driver DP1 which drives the first end (an end portion in a +Y direction) of the X beam (second movable member) 12 in the X direction (first direction) and a second driver DP2 which drives the second end (an end portion in a −Y direction) of the X beam 12 in the X direction. The first driver DP1 can be formed by, for example, a linear motor. More specifically, the first driver DP1 can be formed by the linear motor which includes a mover (first mover) 24R and a stator (first stator) 25R. The mover 24R can be connected to the first end of the X beam 12. The stator 25R can be connected to the side surface of the base plate 13. The guide surface 26 of the guide G can be arranged between the stator 25R and the X movable member 22. In other words, the stator 25R is arranged outside the guide surface 26 as viewed from the movable part MP. Such an arrangement is advantageous in moving the stator 25R that can serve as a heat source away from the movable part MP, and in particular the Y slider 4 (top plate 28) holding the substrate 3 and reducing a heat influence on the substrate 3.

The second driver DP2 can be formed by, for example, a linear motor. More specifically, the second driver DP2 can be formed by the linear motor which includes a mover (second mover) 24L and a stator (second stator) 25L. The mover 24L can be connected to the second end of the X beam 12. The stator 25L can be connected to the side surface of the base plate 13. A guide which constrains the position of the second end of the X beam 12 in the Y direction does not exist on the side of the second end. Accordingly, the distance between the stator 25L and the second end of the X beam (second movable member) changes in accordance with the pivot movement of the X beam 12 about the rotation axis of the rotation bearing 23. Such an arrangement is simpler than an arrangement in which, for example, a θZ stage is arranged on the Y slider 4 and is advantageous in making a stroke with regard to the θZ-axis larger.

A first measurement device MD1 can measure the position of the first end of the X beam 12 in the X direction (first direction). The first measurement device MD1 can be a linear encoder (first linear encoder) made of a detection head 15R which moves together with the first end of the X beam 12 and a scale 16R provided in the base plate 13. A second measurement device MD2 can measure the position of the second end of the X beam 12 in the X direction (first direction). The second measurement device MD2 can be a linear encoder (second linear encoder) made of a detection head 15L which moves together with the second end of the X beam 12 and a scale 16L provided in the base plate 13.

The X beam 12 can pivot about the rotation axis of the rotation bearing 23 on the guide surface BPGS of the base plate 13. The pivot amount of the X beam 12 can be calculated based on a measurement result by the first measurement device MD1 and the second measurement device MD2. The Y slider 4 can move in the Y direction while being guided by the guide surface provided in the X beam 12. The Y slider 4 can be driven in the Y direction by an actuator of the linear motor. The Y slider 4, the top plate 28, and the substrate 3 held by the substrate chuck (not shown) on the top plate 28 can be positioned with regard to the X-axis, the Y-axis, and the θZ-axis.

As exemplified in FIG. 6, the Y slider 4 is arranged so as to surround the X beam 12 partially. In other words, the X beam 12 is arranged so as to extend through the Y slider 4. Static pressure pads (Y yaw static pressure pads) 36a and 36c are arranged to face each other on the sidewall inner surfaces of the Y slider 4, and are guided along the guide surface formed by the side surfaces of the X beam 12 in a non-contact manner. As exemplified in FIG. 5, static pressure pads (static pressure pads at the bottom of the Y slider) 29a, 29b, 29c, and 29d are arranged at the bottom of the Y slider 4, and are supported and guided by the guide surface BPGS of the base plate 13 in the non-contact manner.

Therefore, the base plate 13 supports the substrate 3 via the top plate 28, the Y slider 4, and the static pressure pads 29a, 29b, 29c, and 29d. As exemplified in FIG. 5, preload magnets 32a, 32b, 32c, and 32d are arranged on the bottom surface of the Y slider 4. The preload magnets 32a, 32b, 32c, and 32d are arranged so as to sandwich the static pressure pads 29a, 29b, 29c, and 29d. Suction forces by the preload magnets 32a, 32b, 32c, and 32d are decided so as to ensure a predetermined gap between the guide surface BPGS and the bottom surface of the Y slider 4. When the preload magnets generate preloads as in this embodiment, the guide surface BPGS of the base plate 13 and the guide surface 26 of the guide G can be made of, for example, silicon steel. Instead of the preload magnets, vacuum suction may be adopted as a preload mechanism.

A scale 40 of the linear encoder in the Y direction is arranged on the upper surface of the X beam 12. A detection head 41 of the linear encoder is arranged in the Y slider 4. The linear encoder measures the position of the Y slider 4. A linear motor coil 39 which produces a thrust of driving the Y slider 4 in the Y direction is provided in the X beam 12. A movable magnet 42 is arranged inside the Y slider 4.

Preload magnets 35a, 35b, 35c, and 35d can be adopted as a preload mechanism for the static pressure pads (X yaw static pressure pads) 31a, 31b, and 31c. A pressure generated by the static pressure pads (X yaw static pressure pads) 31a, 31b, and 31c often becomes a high pressure of, for example, 0.3 to 0.4 MPa. Accordingly, if the preload magnets 35a, 35b, 35c, and 35d are arranged inside the static pressure pads 31*a*, 31*b*, and 31*c*, warping may occur in the X movable member 22, the gap between the guide surface 26 and the X movable member 22 may be widened in the end portion, and a pad surface may have a nonuniform pressure distribution. Consequently, the pressure may become unstable, causing a vibration and decreasing positioning accuracy. It is therefore preferable that the preload magnets 35*a*, 35*b*, 35*c*, and 35*d* are arranged outside the static pressure pads (X yaw static pressure pads) 31*a*, 31*b*, and 31*c* of the X movable member 22. This makes it possible to make the gap between the guide surface 26 and the X movable member 22 uniform, reducing the vibration and improving the positioning accuracy.

Figure 7:
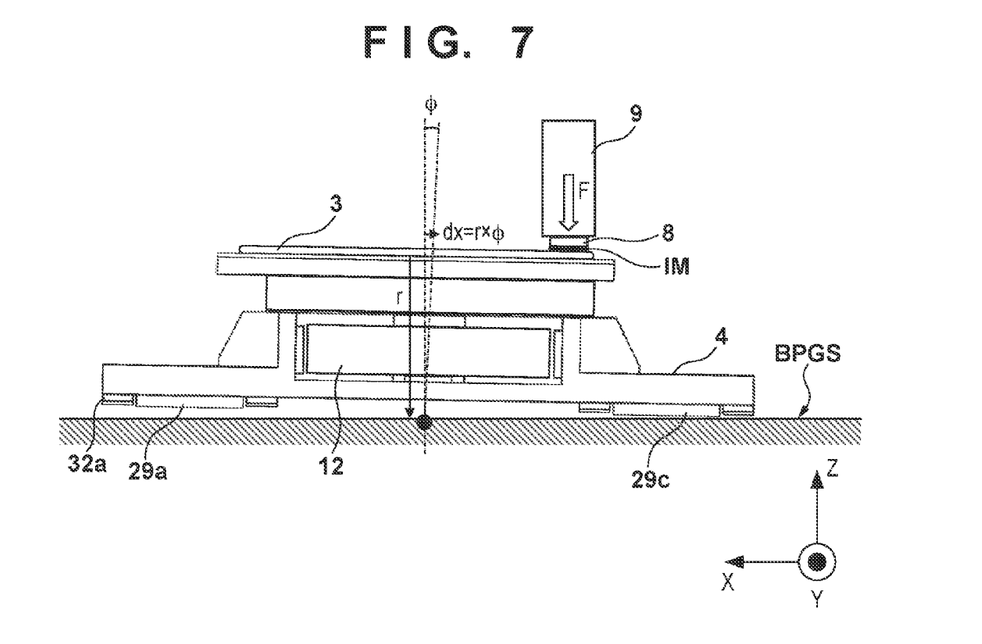
FIG. 7 is a view schematically showing the tilt of the movable part of the positioning apparatus.

FIG. 7 schematically shows the tilt of the Y slider 4 when the mold 8 is brought into contact with an imprint material IM arranged in the shot region of the substrate 3. The Y slider 4 can tilt if the mold 8 is pressed against the imprint material IM arranged in the shot region of the substrate 3 with a force F in order to bring the mold 8 into contact with the imprint material IM. The influence of this tilt appears as a shift amount dx in the X direction. Letting r be a height of the Y slider 4, and φ be a tilt centered at center of the bottom surface of the Y slider 4, the shift amount dx can be given by dx=r×φ. Such a shift amount can be reduced by making the arrangement interval of the static pressure pads (the static pressure pads at the bottom of the Y slider) 29*a*, 29*b*, 29*c*, and 29*d* (the interval between the static pads 29*a* and 29*c* in FIG. 7) larger.

Figure 8:
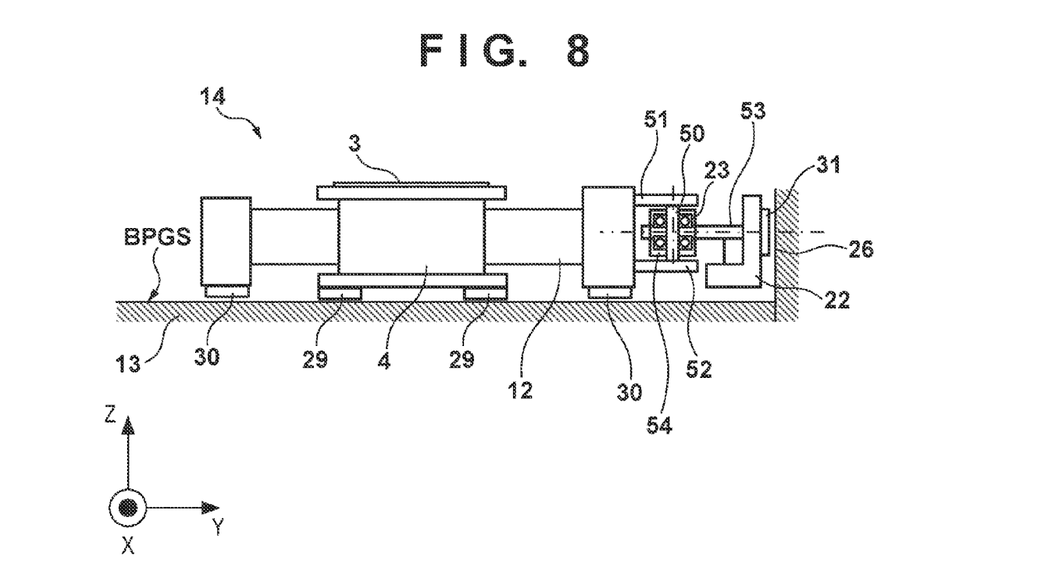
FIG. 8 is a view exemplifying a rotation bearing and its peripheral structure of the positioning apparatus.

FIG. 8 exemplifies the rotation bearing 23 and its peripheral structure. The inner ring of the rotation bearing 23 is fixed to a main shaft 50. The main shaft 50 is connected to the X beam 12 via an upper plate 51 and a lower plate 52. The outer ring of the rotation bearing 23 is stored in a housing 54 and connected to the X movable member 22 via a fixing member 53 extending from the housing 54. It is preferable that the height of the fixing member 53 between the X movable member 22 and the rotation bearing 23 with reference to the guide surface BPGS of the base plate 13 is between the respective heights of the lower end and the upper end of static pressure pads (31*a*, 31*b*, and 31*c*) with reference to the guide surface BPGS. It is further preferable that the height of the fixing member 53 between the X movable member 22 and the rotation bearing 23 with reference to the guide surface BPGS of the base plate 13 matches the center of a direction of the height of the static pressure pads (31*a*, 31*b*, and 31*c*) with reference to the guide surface BPGS. According to such an arrangement, for example, a phenomenon in which the X movable member 22 tilts, and the gap between the static pressure pads 31 and the guide surface 26 becomes nonuniform is reduced when the Y slider 4 is driven in the Y direction in large acceleration/deceleration.

The rotation bearing 23 can support the X movable member 22 with respect to the θX-axis. It is therefore preferable that the rotation bearing 23 is, for example, a roller bearing (for example, a cone roller bearing) or an angular contact ball bearing. The static pressure pads such as the static pressure pads 31*a*, 31*b*, and 31*c* can be, for example, porous pads or inherent restrictor pads.

Figure 9:
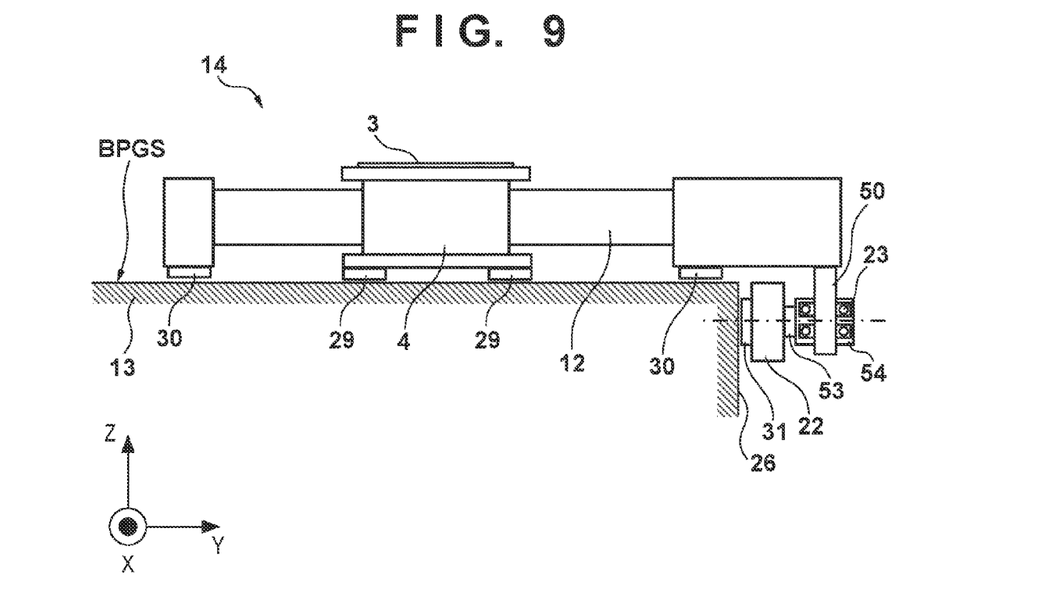
FIG. 9 is a view showing a modification.

FIG. 9 describes a modification of the positioning apparatus 14. In an example shown in FIG. 9, the guide surface 26 is formed by the side surface of the base plate 13. Also in this example, the inner ring of the rotation bearing 23 is fixed to the main shaft 50, and the main shaft 50 is connected to the X beam 12. The outer ring of the rotation bearing 23 is stored in the housing 54 and connected to the X movable member 22 via the fixing member 53 extending from the housing 54.

It is preferable that the height of the fixing member 53 between the X movable member 22 and the rotation bearing 23 with reference to the guide surface BPGS of the base plate 13 is between the respective heights of the lower end and the upper end of the static pressure pads 31 (31*a*, 31*b*, and 31*c*) with reference to the guide surface BPGS. It is further preferable that the height of the fixing member 53 between the X movable member 22 and the rotation bearing 23 with reference to the guide surface BPGS of the base plate 13 matches the center of the direction of the height of the static pressure pads 31 (31*a*, 31*b*, and 31*c*) with reference to the guide surface BPGS.

A method of manufacturing an article will be described below. As an example, an article manufacturing method of manufacturing a device (a semiconductor integrated circuit device, a liquid crystal display device, or the like) as an article will be described here. The article manufacturing method includes a step of forming a pattern onto a substrate (a wafer, a glass plate, or a film-like substrate) using the lithography apparatus such as the above-described imprint apparatus. The manufacturing method can further include a step of processing (for example, etching) the substrate onto which the pattern has been formed. Note that when manufacturing another article such as a patterned medium (storage medium) or an optical element, the manufacturing method can include, instead of etching, another process of processing the substrate on which the pattern has been formed.

The pattern of the cured product formed by using the imprint apparatus serving as the lithography apparatus is used permanently for at least some of various articles or used temporarily when the various articles are manufactured. The article includes an electric circuit element, an optical element, a MEMS, a printing element, a sensor, a mold, or the like. The electric circuit element includes, for example, a volatile or nonvolatile semiconductor memory such as a DRAM, an SRAM, a flash memory, or an MRAM or a semiconductor element such as an LSI, a CCD, an image sensor, or an FPGA. The mold includes, for example, an imprinting mold.

The pattern of the cured product is used without any change as a constituent member of at least part of the above-described article or used temporarily as a resist mask. The resist mask is removed after etching, ion implantation, or the like is performed in a processing step of the substrate.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2016-098152, filed May 16, 2016, which is hereby incorporated by reference herein in its entirety.

What is claimed is:

1. A positioning apparatus configured to move a movable part on a surface parallel to a first direction and a second direction perpendicular to each other, and comprising a single guide serving as a guide configured to constrain a position of the movable part in the second direction and a drive mechanism configured to drive the movable part, wherein the movable part includes
a first movable member movable in the first direction while being guided by the guide, a second movable member having a first end and a second end, the first end being connected to the first movable member via a rotation bearing and moving above the surface, and a third movable member movable within a predetermined range between the first end and the second end while being guided by the second movable member, and the drive mechanism includes a first driver configured to drive the first end of the second movable member in the first direction, and a second driver configured to drive the second end of the second movable member in the first direction.

2. The apparatus according to claim 1, wherein the guide has a guide surface parallel to the first direction, the first movable member being guided by the guide surface via a first static pressure bearing, the first driver includes a first stator and a first mover configured to move together with the second movable member, and the guide surface is arranged between the first stator and the first movable member.

3. The apparatus according to claim 2, further comprising a first linear encoder configured to measure a position of the first mover, wherein the first linear encoder includes a detection head configured to move together with the first mover.

4. The apparatus according to claim 2, wherein the guide surface is perpendicular to the surface.

5. The apparatus according to claim 2, wherein a height of a fixing member between the first movable member and the rotation bearing with reference to the surface is between respective heights of a lower end and an upper end of the first static pressure bearing with reference to the surface.

6. The apparatus according to claim 2, wherein the surface is formed by an upper surface of a base plate, and the guide surface is formed by a side surface of the base plate.

7. The apparatus according to claim 1, wherein the second driver includes a second stator and a second mover configured to move together with the second movable member, and a distance between the second stator and the second end of the second movable member changes in accordance with a pivot movement of the second movable member about a rotation axis of the rotation bearing.

8. The apparatus according to claim 7, further comprising a second linear encoder configured to measure a position of the second mover, wherein the second linear encoder includes a detection head configured to move together with the second mover.

9. The apparatus according to claim 1, wherein the second movable member is guided by the surface via a second static pressure bearing.

10. The apparatus according to claim 1, wherein the third movable member is guided by the surface via a third static pressure bearing.

11. A lithography apparatus comprising a positioning apparatus configured to position a substrate, and configured to transfer an original pattern to the substrate, wherein the positioning apparatus is configured to move a movable part on a surface parallel to a first direction and a second direction perpendicular to each other, and comprising a single guide serving as a guide configured to constrain a position of the movable part in the second direction and a drive mechanism configured to drive the movable part, wherein the movable part includes a first movable member movable in the first direction while being guided by the guide, a second movable member having a first end and a second end, the first end being connected to the first movable member via a rotation bearing and moving above the surface, a third movable member movable within a predetermined range between the first end and the second end while being guided by the second movable member, and a substrate chuck mounted on the third movable member and configured to chuck the substrate, and wherein the drive mechanism includes a first driver configured to drive the first end of the second movable member in the first direction, and a second driver configured to drive the second end of the second movable member in the first direction.

12. The lithography apparatus according to claim 11, wherein the lithography apparatus is configured as one of an imprint apparatus and an exposure apparatus.

13. A method of manufacturing an article, comprising:

transferring a pattern to a substrate by using a lithography apparatus; and processing the substrate to which the pattern has been transferred to obtain the article, wherein the lithography apparatus comprises a positioning apparatus configured to position the substrate, and configured to transfer an original pattern to the substrate, wherein the positioning apparatus is configured to move a movable part on a surface parallel to a first direction and a second direction perpendicular to each other, and comprising a single guide serving as a guide configured to constrain a position of the movable part in the second direction and a drive mechanism configured to drive the movable part, wherein the movable part includes a first movable member movable in the first direction while being guided by the guide, a second movable member having a first end and a second end, the first end being connected to the first movable member via a rotation bearing and moving above the surface, a third movable member movable within a predetermined range between the first end and the second end while being guided by the second movable member, and a substrate chuck mounted on the third movable member and configured to chuck the substrate, and wherein the drive mechanism includes a first driver configured to drive the first end of the second movable member in the first direction, and a second driver configured to drive the second end of the second movable member in the first direction.

* * * * *